United States Patent [19]
Dumoulin et al.

[11] Patent Number: 5,548,216
[45] Date of Patent: Aug. 20, 1996

[54] METHODS FOR THE SIMULTANEOUS DETECTION OF MULTIPLE MAGNETIC RESONANCE IMAGES USING PHASE MODULATED EXCITATION

[75] Inventors: Charles L. Dumoulin, Ballston Lake; Christopher J. Hardy, Schenectady, both of N.Y.

[73] Assignee: General Electric Company, Schenectady, N.Y.

[21] Appl. No.: 558,298

[22] Filed: Nov. 15, 1995

[51] Int. Cl.⁶ ..................................... G01V 3/00
[52] U.S. Cl. .................. 324/309; 324/307; 324/306
[58] Field of Search ..................... 324/309, 307, 324/306, 312, 314, 300; 128/653.5

[56] References Cited

U.S. PATENT DOCUMENTS

| | | | |
|---|---|---|---|
| 4,871,966 | 10/1989 | Smith et al. | 324/309 |
| 5,212,448 | 5/1993 | Le Roux et al. | 324/309 |
| 5,406,203 | 4/1995 | Oh et al. | 324/309 |
| 5,422,572 | 6/1995 | Yao | 324/309 |
| 5,438,263 | 8/1995 | Dworkin et al. | 324/309 |

OTHER PUBLICATIONS

"Simultaneous Acquisition of Phase–Contrast Angiograms and Stationary–Tissue Images with Hadamard Encoding of Flow–induced Phase Shifts" by C. L. Dumoulin, S. P. Souza, R. D. Darrow, N. J. Pelc, W. J. Adams, S. A. Ash, Journal of Magnetic Resonance Imaging Jul./Aug. 1991, pp. 399–404.

*Primary Examiner*—Louis M. Arana
*Attorney, Agent, or Firm*—Lawrence P. Zale; Marvin Snyder

[57] ABSTRACT

A multi-planar imaging method employs magnetic resonance to detect image data from multiple planes within a subject. Data from each plane are detected in response to the same readout gradient and are simultaneously detected. The image planes can be arbitrarily oriented with respect to each other and with respect to the readout and phase-encoding image formation magnetic field gradient pulses if desired. Overlap of image data from each of the excited image planes in the acquired image is prevented by modulating the phase of each RF excitation pulse in concert with the amplitude of the phase-encoding gradient pulse to cause the image data from each excitation plane to be displaced by a unique amount in the phase-encoding direction.

10 Claims, 5 Drawing Sheets

METHODS FOR THE SIMULTANEOUS DETECTION OF MULTIPLE MAGNETIC RESONANCE IMAGES USING PHASE MODULATED EXCITATION

BACKGROUND OF THE INVENTION

1. Field of the Invention

This invention relates to magnetic resonance (MR) imaging and more specifically to the simultaneous detection of multiple MR images from a patient.

2. Description of Related Art

Several methods for the detection of multiple two-dimensional magnetic resonance images in a single examination are currently in use. These include the acquisition of a three-dimensional matrix of image data which is retrospectively examined by the extraction of arbitrarily oriented two-dimensional slices, or planes, and the interleaved acquisition of arbitrarily oriented spin-echo images as disclosed by Smith et. al. in U.S. Pat. No. 4,871,966 issued Oct. 3, 1989.

Typically, interleaved acquisition of magnetic resonance data is accomplished by the excitation, and detection of magnetic resonance data, from a first arbitrarily oriented slice of a subject, followed by the excitation and detection of a second arbitrarily oriented slice, which in turn is followed by excitation and detection of subsequent slices. During the excitation and detection of each slice, the longitudinal magnetization in each of the remaining slices is allowed to return to its equilibrium value to provide the desired image contrast. In traditional spin-warp implementations of the interleaved acquisition method, the steps of excitation and detection of magnetic resonance data are repeated many times, each time with a unique amplitude of a phase-encoding magnetic field gradient pulse. Fourier transformation of each detected MR data set provides spatial information in a first direction while Fourier transformation of the data with respect to the amplitude of the phase-encoding gradient pulse provides spatial information in a second direction typically orthogonal to the first direction.

One disadvantage of the interleaved data acquisition strategy described above is that periods of time exist during the excitation and detection of data in which no magnetic field gradient activity is present. This is particularly true for image acquisition in which the echo time, TE, is relatively long. An undesirable consequence of these periods of gradient inactivity is that the maximum number of slices which can be detected in a single exam is limited. The number of detectable slices can be determined by dividing the time allowed for the recovery of longitudinal magnetization, TR, by the time it takes to excite and detect data from each slice. This period of time is equal to the echo time, TE, plus the additional time required to fully excite and detect the transverse magnetization.

Presently, there is a need for a more efficient method for the generation of multiple slice images in which the number of detected slices is increased.

SUMMARY OF THE INVENTION

Pulse sequences for the simultaneous detection of image data from multiple excitation planes are disclosed. These pulse sequences employ a multi-step excitation which excites a surface having a complex geometry. This geometry can be either a set of parallel planes or a set of intersecting planes, each plane arbitrarily oriented with respect to one another. Transverse magnetization in all the excitation planes is simultaneously refocused by a single refocusing radio frequency (RF) pulse to cause the formation of spin echoes from all excited planes to be simultaneously detected in the presence of a common readout magnetic field gradient pulse. The steps of excitation and detection are repeated a number of times, each incorporating a phase-encoding magnetic field gradient pulse of a selected amplitude. For each repetition, an MR response signal is detected in the presence of a constant amplitude readout.

In the present invention, the transverse magnetization in each of the excitation planes is given a phase shift which is made to be proportional to the amplitude of the phase-encoding magnetic field gradient pulse. Each excitation plane, however, is given a unique constant of proportionality.

Upon completion of the exam, the acquired data are Fourier transformed to give a single two-dimensional image. Since each excitation plane has a unique phase shift history, each excitation plane appears with a unique offset in the phase-encoding direction. If desired, the single computed image can be subjected to post-processing steps to extract selected portions of the data and place them in individual image data files.

OBJECTS OF THE INVENTION

It is an object of the present invention to provide a method for the simultaneous excitation and detection of multiple image planes within a subject.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawing in which:

DETAILED DESCRIPTION OF THE INVENTION

Figure 1:
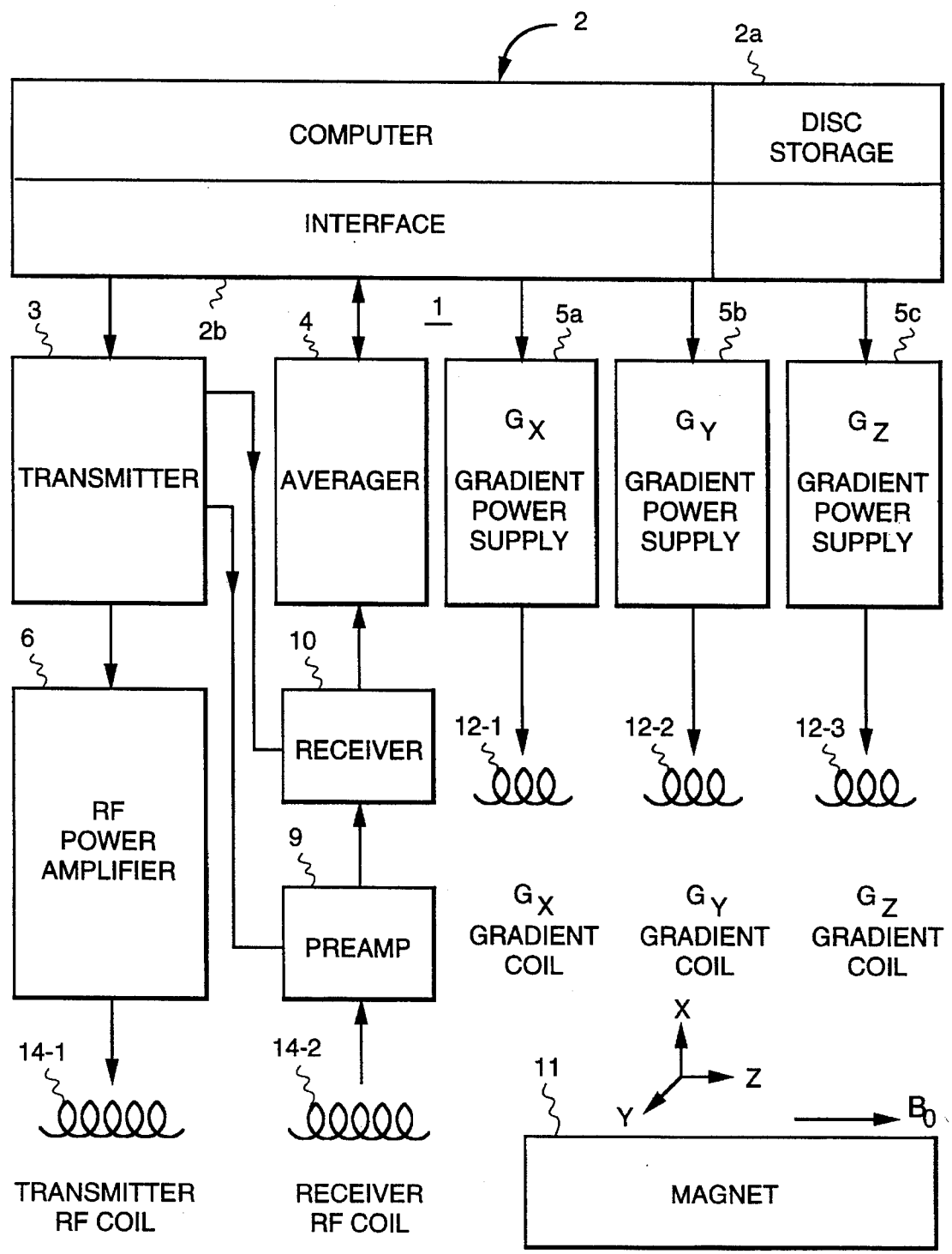
FIG. 1 is a is a simplified block diagram of the major components of a magnetic resonance (MR) imaging system suitable for use with the present invention.

FIG. 1 is a simplified block diagram of the major components of a magnetic resonance (MR) imaging system suitable for use with the invention described herein. The system is made up of a general purpose mini-computer 2 which is functionally coupled to a disk storage unit 2a and an interface unit 2b. A radiofrequency (RF) transmitter 3, signal averager 4, and gradient power supplies 5a, 5b and 5c, are all coupled to computer 2 through interface unit 2b.

Gradient power supplies 5a, 5b, 5c energize gradient coils 12-1, 12-2, 12-3 to create magnetic field gradients $G_x$, $G_y$, $G_z$, respectively, in the "X", "Y", "Z" directions, respectively, over a subject desired to be imaged. RF transmitter 3 is gated with pulse envelopes from computer 2 to generate RF pulses having the required modulation to excite an MR response signal from the subject. The RF pulses are amplified in an RF power amplifier 6 to levels varying from 2 Watts (W) to several kilowatts (kW), depending on the imaging method, and applied RF transmit coil 14-1. The higher power levels are necessary for large sample volumes, such as in whole body imaging, and where short duration pulses are required to excite large MR frequency bandwidths in larger RF coils.

MR response signals are sensed by a receiver coil 14-2, amplified in a low noise preamplifier 9 and passed to receiver 10 for further amplification, detection, and filtering. The signal is then digitized for averaging by signal averager 4 and for processing by computer 2. Preamplifier 9 and receiver 10 are protected from the RF pulses during transmission by active gating or by passive filtering.

Computer 2 provides gating and envelope modulation for the MR pulses, blanking for the preamplifier and RF power amplifier, and voltage waveforms for the gradient power supplies. The computer also performs data processing such as Fourier transformation, image reconstruction, data filtering, imaging display, and storage functions (all of which are conventional and outside the scope of the present invention).

RF transmitter coil 14-1 and receiver coil 14-2, if desired, may comprise a single coil. Alternatively, two separate coils that are electrically orthogonal may be used. The latter configuration has the advantage of reduced RF pulse breakthrough into the receiver during pulse transmission. In both cases, the coils are orthogonal to the direction of a static magnetic field $B_0$ produced by a magnet means 11. The coils may be isolated from the remainder of the system by enclosure in an RF shielded cage.

In the present embodiment of the invention, the subject is placed within the magnet of a magnetic resonance (MR) imaging system. The region over which multiple images are desired is then identified by an operator, perhaps with the assistance of a conventional MR imaging sequence. A pulse sequence is then applied and the data reconstructed.

Figure 2:
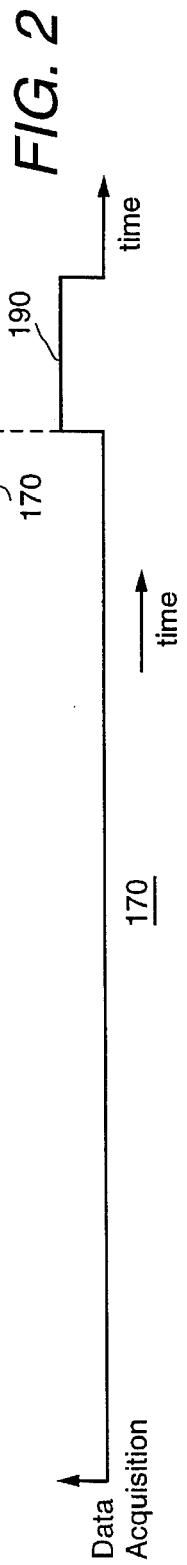
FIG. 2 is a pulse sequence diagram of a first embodiment of the present invention which can be used to excite multiple parallel planes within a subject.

FIG. 2 is a pulse sequence timing diagram of radio frequency (RF) pulses and magnetic field gradient pulses employed in a first embodiment of the present invention which may be executed by the MR imaging system. Pulse sequence 100 is comprised of an excitation RF pulse 130 which in turn is comprised of a series of discrete RF pulses 130a, 130b, 130c ... 130n, each applied in the presence of a simultaneously applied composite slice selective gradient pulse 140 comprised of slice selective magnetic field gradient pulses 140a, 140b, 140c ... 140n and a final refocusing pulse 145. Excitation pulse 130 nutates spin magnetization in selected portions of the subject determined by the frequency of discrete RF pulses 130a, 130b, 130c ... 130n and the amplitude and direction of slice selective magnetic field gradient pulses 140a, 140b, 140c ... 140n. The degree of nutation can be selected by selecting the duration and amplitude of each discrete excitation pulse 130a, 130b, 130c ... 130n.

An important aspect of slice selective magnetic field gradient pulses 140a, 140b, 140c ... 140n is that the polarity of each slice selective magnetic field gradient pulse is opposite that of its neighbors.

The series of slice selective magnetic field gradient pulses is followed by final refocusing pulse 145 which has half the area of each of the slice selective magnetic field gradient pulses. This causes the phase of transverse spin magnetization for all excited nuclear spins within the subject to be substantially the same at the end of final refocusing pulse 145. This is illustrated by considering the phase of transverse spin magnetization in the portion of the subject excited by first discrete RF pulse 130a and first slice selective magnetic field gradient pulse 140a. At time to discrete RF pulse 130a can be considered to create transverse spin magnetization, even though in reality the RF pulse has only been half completed. At time $t_1$, the transverse magnetization has been dephased by an amount proportional to the product of the duration and amplitude (i.e. the area) of the gradient pulse between the times $t_0$ and $t_1$. Since the amplitude of second slice selective magnetic field gradient pulse is opposite that of the first, at time $t_2$, the transverse magnetization of the first excited portion is once again in phase. At time $t_2$, the excitation of the second excited portion of the subject can be considered to take place. The entire process is repeated, such that the center of each RF pulse occurs at a point in time in which all existing transverse spin magnetization is in phase. At the end of last slice selective magnetic field gradient pulse 140n, the transverse magnetization in all excited portions of the subject is dephased. Final refocusing pulse 145 is then applied to bring all the transverse magnetization in phase.

After excitation RF pulse 130 and composite slice selective gradient pulse 140 are applied a refocusing pulse subsequence 110 is applied. Refocusing pulse subsequence 110 is comprised of a first crusher gradient pulse 112a applied in a selected direction, a second crusher gradient pulse 112b having an amplitude, duration and direction as that of the first, a refocusing RF pulse 114 having a flip angle of substantially 180 degrees, and a refocusing gradient pulse 116 applied in a selected direction which is independent of the directions of the other magnetic field gradient pulses. Refocusing pulse subsequence 110 refocuses transverse spin magnetization over a selected portion of the subject which is chosen to include part or all of each of the excited portions of the subject.

After refocusing pulse subsequence 110 is applied, a phase-encoding magnetic field gradient pulse 160 of a selected amplitude is applied. Phase-encoding gradient pulse 160 is applied in a direction substantially orthogonal to composite slice selective gradient pulse 140 and can be applied simultaneously with second crusher gradient pulse 112b if desired. For the sake of clarity, phase-encoding pulse 160, and second crusher gradient pulse 112b are not shown to be simultaneous in FIG. 2. Note also, that it is possible to place phase-encoding gradient pulse 160 before refocusing pulse subsequence 110 if desired.

During the application of phase-encoding gradient pulse 160, a readout dephasing magnetic field gradient pulse 170 of a selected amplitude is applied. Readout dephasing gradient pulse 170 is applied in a direction substantially orthogonal to both composite slice selective gradient pulse 140 and phase-encoding pulse 160. Readout dephasing pulse 170 causes transverse magnetization at different positions along the direction of the readout dephasing magnetic field gradient to obtain phase shifts which are proportional to position in the readout direction.

Following the application of readout dephasing pulse 170, a readout magnetic field gradient pulse 180 is applied. Readout magnetic field gradient pulse 180 is applied in the same direction as readout dephasing pulse 170, but is given the opposite polarity. The amplitude and duration of readout magnetic field gradient pulse 180 are selected so that substantially all transverse spin magnetization has an identical phase shift at a selected point during readout magnetic field gradient pulse 180.

Substantially simultaneously with the application of readout magnetic field gradient pulse 180, a data acquire signal pulse 190 is sent to a data acquisition subsystem which is part of the imaging system. MR response signals are digitized during data acquire pulse 190. Since the MR response signals coming from resonant nuclei within the selected portions of the subject are acquired during readout magnetic field gradient pulse 180, each detected MR response signal will have a frequency which is proportional to the location of the resonant nuclei which generated said signal. The location of each signal source can be determined by applying a Fourier transformation to the acquired signal data in a fashion well known to those skilled in the art.

In the present invention pulse sequence 100 is repeated a plurality, Y, times. In each of the Y repetitions, phase-encoding gradient pulse 160 is given a different amplitude. Phase-encoding gradient pulse 160 causes phase shifts in the detected MR signals which are proportional to the position of the resonant nuclei along the direction of phase-encoding magnetic field gradient pulse 160. Data acquired responsive to different amplitudes of phase-encoding gradient 160 can be Fourier transformed to give the position (in the direction of phase-encoding gradient pulse 160) of the resonant nuclei in a manner well known to those skilled in the art. This direction is commonly referred to as a "phase-encoding" direction.

In the present invention each discrete RF pulse 130a, 130b, 130c . . . 130n is given a phase shift which is proportional to the phase of phase-encoding gradient pulse 160 in each of the Y repetitions of pulse sequence 100. The constant of proportionality is selected to be unique for each RF pulse. This gives a unique incremental phase shift for each of the excited portions of the subject which, in turn, causes each excited portion to appear with a unique offset in the phase-encoding direction.

Table 1 illustrates the phase shift increment (in degrees) required to cause the image of each portion in a four portion excitation to be shifted a given amount where an offset of ½ would indicate the portion is shifted to the edge of the field-of-view, and an offset of zero would indicate that the portion would remain at the center of the field-of-view.

TABLE 1

| Excited Portion | Offset (units of field of View) | Phase Increment |
| --- | --- | --- |
| 1 | −⅜ | −135° |
| 2 | −⅛ | −45° |
| 3 | ⅛ | 45° |
| 4 | ⅜ | 135° |

Figure 3:
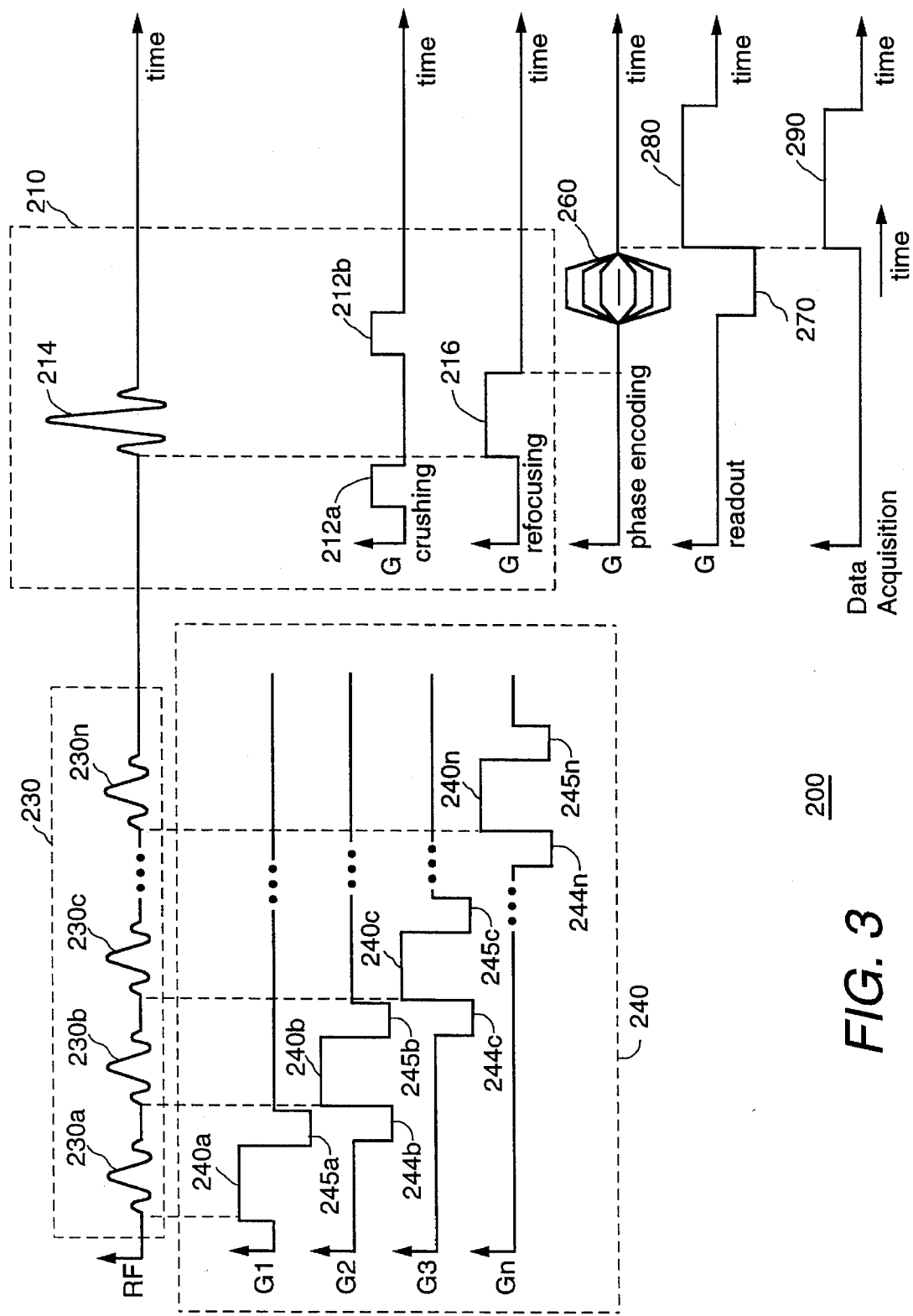
FIG. 3 is a pulse sequence diagram of a second embodiment of the present invention which can be used to excite multiple non-parallel planes within a subject.

A second embodiment of the current invention is shown in FIG. 3. FIG. 3 is a pulse sequence diagram of RF pulses and magnetic field gradient pulses which may be executed by the MR imaging system. Pulse sequence 200 is comprised of an excitation RF pulse 230 which in turn is comprised of a series of discrete RF pulses 230a, 230b, 230c . . . 230n, applied in the presence of a composite slice selective gradient pulse 240 comprised of slice selective magnetic field gradient pulses 240a, 240b, 240c . . . 240n, slice defocusing magnetic field gradient pulses 244b, 244c . . . 244n and slice refocusing magnetic field gradient pulses 245a, 245b, 245c . . . 245n. Excitation pulse 230 nutates spin magnetization in selected portions of the subject determined by the frequency of discrete RF pulses 230a, 230b, 230c . . . 230n and the amplitude and direction of slice selective magnetic field gradient pulses 240a, 240b, 240c . . . 240n. The degree of nutation can be selected by selecting the duration and amplitude of each discrete excitation pulse 230a, 230b, 230c . . . 230n. Note that unlike the first embodiment in which multiple parallel planes of the subject are excited, in the second embodiment, each plane can be obliquely oriented with respect to all other planes.

An important aspect of slice selective magnetic field gradient pulses 240a, 240b, 240c . . . 240n is that each is immediately followed by refocusing magnetic field gradient pulses 245a, 245b, 245c . . . 245n which are applied with an opposite polarity as shown in FIG. 3. Also, the second through last slice selective magnetic field gradient pulses 240b, 240c . . . 240n are preceded by defocusing magnetic field gradient pulses 244b, 244c . . . 244n. This causes the phase of transverse spin magnetization for all excited nuclear spins within the subject to be substantially the same at the end of final refocusing pulse 245n in a fashion similar to that of first pulse sequence 100.

After excitation RF pulse 230 and composite slice selective gradient pulse 240 are applied a refocusing pulse subsequence 210 is applied. Refocusing pulse subsequence 210 is comprised of a first crusher gradient pulse 212a applied in a selected direction, a second crusher gradient pulse 212b having an amplitude, duration and direction the same as the first, a refocusing RF pulse 214 having a flip angle of substantially 180 degrees and a refocusing gradient pulse 216 applied in a selected direction which is independent of the directions of the other magnetic field gradient pulses. Refocusing pulse subsequence 210 refocuses transverse spin magnetization over a selected portion of the subject which is chosen to include part or all of each of the excited portions of the subject.

After excitation refocusing pulse subsequence 210 is applied, a phase-encoding magnetic field gradient pulse 260 of a selected amplitude is applied. Phase-encoding gradient pulse 260 is applied in a direction which need not be orthogonal to composite slice selective gradient pulse 240 and can be applied simultaneously with second crusher gradient pulse 212b if desired. For the sake of clarity, phase-encoding pulse 260, and second crusher gradient pulse 212b are not shown to be simultaneous in FIG. 3.

During the application of phase-encoding gradient pulse 260, a readout dephasing magnetic field gradient pulse 270 of a selected amplitude is applied. Readout dephasing gradient pulse 270 is applied in a direction substantially orthogonal to phase-encoding pulse 260 but may be applied in a direction which is not orthogonal to slice selective magnetic field gradient pulses 240a, 240b, 240c . . . 240n. Readout dephasing pulse 270 causes transverse magnetization at different positions along the direction of the readout dephasing magnetic field gradient to obtain phase shifts which are proportional to position in the readout direction.

Following the application of readout dephasing pulse 270, a readout magnetic field gradient pulse 280 is applied. Readout magnetic field gradient pulse 280 is applied in the same direction as readout dephasing pulse 270, but is given the opposite polarity. The amplitude and duration of readout magnetic field gradient pulse 280 is selected so that substantially all transverse spin magnetization has an identical phase shift at a selected point during readout magnetic field gradient pulse 280.

Substantially simultaneously with the application of readout magnetic field gradient pulse 280, a data acquire signal pulse 290 is sent to a data acquisition subsystem which is part of the imaging system. MR response signals are digitized during data acquire pulse 290. Since the MR response signals coming from resonant nuclei within the selected portions of the subject are acquired during readout magnetic field gradient 280, each detected MR response signal will have a frequency which is proportional to the location of the resonant nuclei which generated said signal. The location of each signal source can be determined by applying a Fourier transformation to the acquired signal data in a fashion well known to those skilled in the art.

In the present invention pulse sequence 200 is repeated a plurality, Y, times. In each of the Y repetitions, phase-encoding pulse 260 is given a different amplitude. Phase-encoding pulse 260 causes phase shifts in the detected MR signals which are proportional to the position of resonant nuclei giving rise to transverse spin magnetization along the direction of phase-encoding magnetic field gradient pulse 260. Data acquired responsive to different amplitudes of phase-encoding gradient 260 can be Fourier transformed to give the position (in the direction of phase-encoding gradient 260) of the resonant nuclei producing transverse spin magnetization in a manner well known to those skilled in the art. This direction is commonly referred to as a "phase-encoding" direction.

In the second embodiment of the present invention the phase shift of each discrete RF pulse 230a, 230b, 230c . . . 230n is given a phase shift which is proportional to the phase of phase-encoding gradient pulse 260 in each of the Y repetitions of pulse sequence 200. The constant of proportionality is selected to be unique for each RF pulses. This gives a unique incremental phase shift for each of the excited portions of the subject which, in turn, causes each excited portion to appear with a unique offset in the phase-encoding direction.

Figure 4:
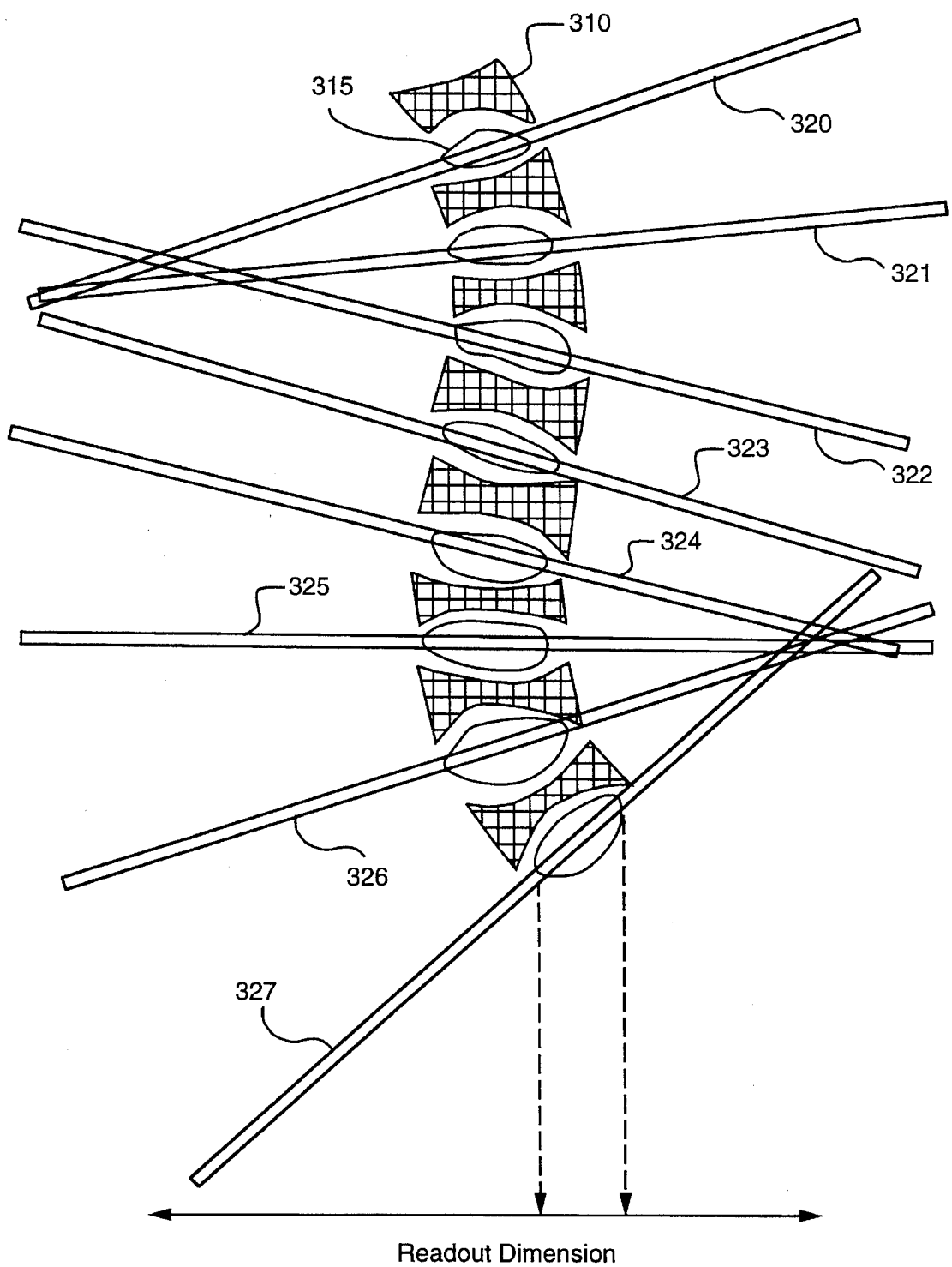
FIG. 4 is a drawing of a sagittal section through vertibrae of a subject illustrating several imaging planes through the subject.

FIG. 4 illustrates one application of the second embodiment of the present invention. In FIG. 4 a cross-sectional representation of a spine of a subject is shown. This cross-section is depicted as an arbitrarily thin slice showing the spine as it would appear when viewed from the subject's left side. The spine is comprised of a sequence of vertebral bodies 310 and cartilaginous disks 315. In the illustration of FIG. 4, excitation planes 320, 321, 322 . . . 327 are placed through each of the disks shown. Note that each excitation plane is obliquely oriented with respect to the others.

In the second embodiment of the present invention the multiple oblique excitation planes are detected with mutually orthogonal readout and phase-encoding directions. According to the orientation shown in FIG. 4, the readout direction is along the subject's anterior/posterior axis while the phase-encoding direction is along the subject's left/right axis. In the absence of phase modulation of each RF pulse 230a, 230b, 230c . . . 230n, the images acquired from transverse magnetization excited in each excitation plane would overlap and cause the final images to overlap. By incrementing the phase of each RF pulse, however, the images from each excitation plane are offset a unique amount in the phase-encoding direction. If the offsets are smaller than size of the anatomic structures being imaged, however, image overlap will still occur.

To circumvent this problem, refocusing gradient pulse 216 can be applied in a direction substantially parallel to the direction of phase-encoding magnetic field gradient pulse 260 and with an amplitude chosen to cause refocusing of transverse spin magnetization only in a thick slab which is placed to encompass all of the subject's disks. Since only regions of anatomy which have been subjected to both the excitation and refocusing RF pulses will provide signal intensity in the final image, the incorporation of a thick-slab refocusing pulse limits the anatomic region which contributes to the final image. Consequently, the unique offset which is applied to each disk can be relatively small and it is possible to display images from each of the excitation planes in a single image.

Figure 5:
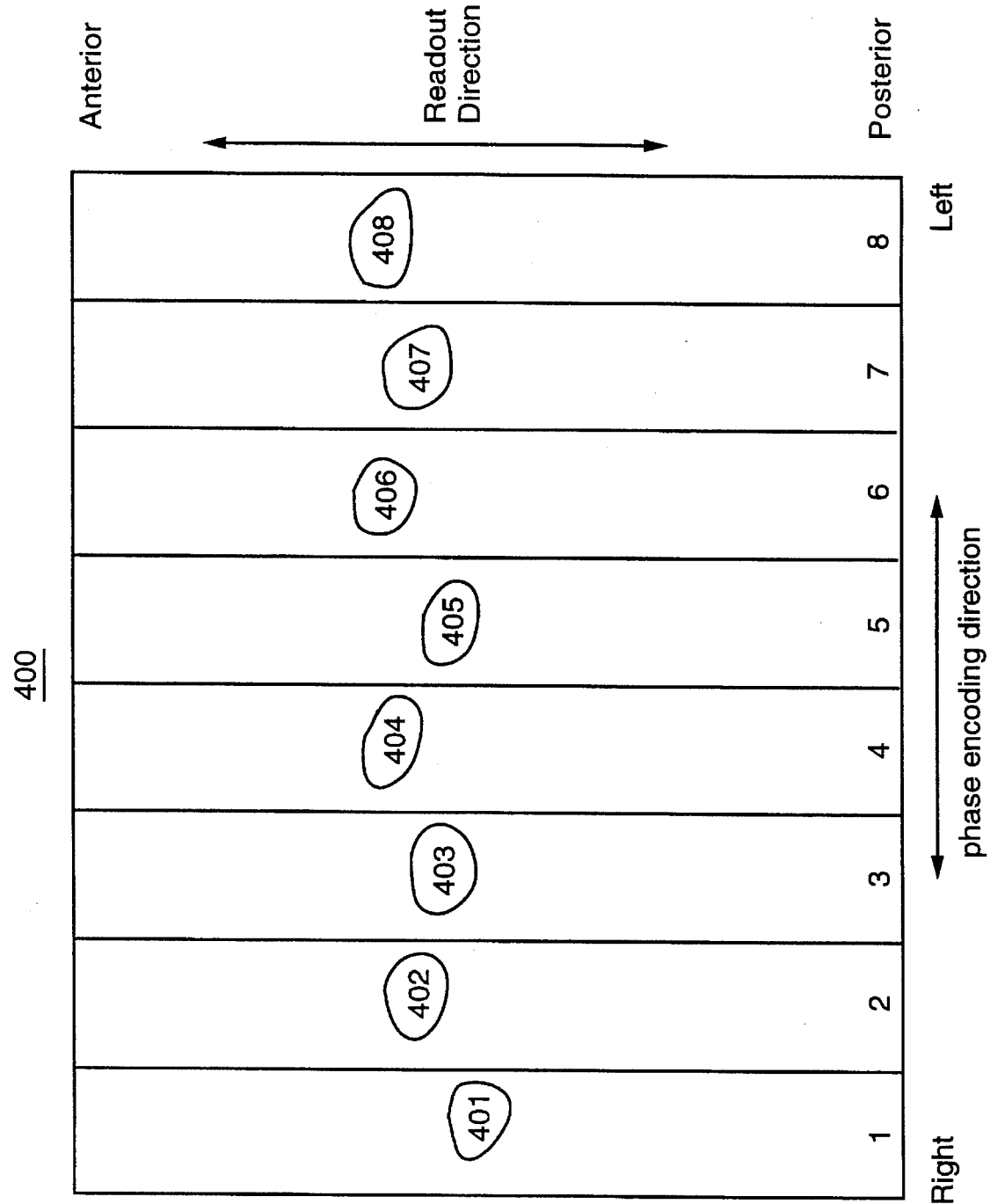
FIG. 5 is a drawing of an MR image obtained with the pulse sequence of FIG. 3 illustrating each of the oblique image planes of FIG. 4.

FIG. 5 illustrates one form that data acquired with the present invention can take. Here, a single MR image 400, is acquired using the pulse sequence shown in FIG. 3 with the excitation geometry shown in FIG. 4. Eight disks 401, 402, 403 . . . 408, excited with excitation planes 320, 321, 322 . . . 327 are portrayed in image 400. Each disk appears in a unique strip of the total image. The left/right displacement of each disk image is determined by the phase shifts which are given to the corresponding RF excitation pulse. The displacement in the subject's anterior/posterior direction is determined by the location of anatomy as detected with by readout gradient pulse 280.

Unlike conventional MR imaging, the second embodiment of the present invention has its excitation planes arbitrarily oriented with respect to each other and with respect to phase-encoding gradient pulse 260 and readout gradient pulse 280. Consequently, the image data from each excitation plane is not displayed with a one-to-one aspect ratio. The orientation of the excitation planes are known, however, and it is relatively straightforward to restore a one-to-one aspect ratio in the image data by using stretching algorithms using linear or higher-order interpolations of the image data.

Other post-processing steps are possible to manipulate the acquired image data. For example, the image data from each anatomic section can be extracted from the acquired image and placed in its own image file for display and archiving purposes.

In addition to post-processing variants of the present invention, a number of variations to the pulse-sequence itself are possible. For example, excitation and detection of data from M additional different sets of excitation planes can be performed during periods in which longitudinal spin magnetization is allowed to recover from the acquisition of MR data from the first set of planes. This embodiment of the pulse sequence permits the detection of more image planes without increasing the total scan time.

Another variation is the use of alternative phase-modulation strategies to separate the signals arising from each portion of anatomy. One such approach is the use of Hadamard encoding schemes in which the phase of each RF excitation is varied H times according to a Hadamard matrix and images from each portion of the subject's anatomy are calculated directly by taking linear combinations of the H acquired sets of data in a fashion analogous to the way individual velocity components can be computed in multiplexed phase-contrast MR angiography as described by Dumoulin et. al. in "Simultaneous Acquisition of Phase-Contrast Angiograms and Stationary-Tissue Images with Hadamard Encoding of Flow-induced Phase Shifts", *Journal of Magnetic Resonance Imaging*, 1:399–404, (1991).

Another possible variant is the use of a refocusing subsequence which is geometrically matched to the excitation subsequence. This could be done by substantially repeating the discrete RF excitation pulses and their associated gradient pulses with a 180° nutation in place of the thick slab refocusing subsequence previously disclosed. While this will increase the echo time, TE, it will permit more complete recovery of longitudinal magnetization when multiple collections of excitation planes are acquired.

Still another possible variant of the present invention is the extension of the pulse sequence for the acquisition of additional echoes to obtain multiple images, each with a unique echo time, TE. This could be accomplished by repeating the refocusing subsequence after the completion of data acquisition and applying a second readout gradient pulse concurrent with a second data acquire pulse. Additional echoes can be acquired in this fashion if desired.

Additional variations of multiple-echo embodiments of the present invention are possible. These include the incorporation of additional phase-encoding gradient pulses before each echo in a fashion similar to that used in conventional Fast Spin Echo techniques. This permits a shorter scan time since the Y phase-encoding steps needed to acquire data for image formation are acquired in Y/P applications of the pulse sequence, where P represents the number of echoes.

While several presently preferred embodiments of the novel methods for the simultaneous detection of multiple MR images have been described in detail herein, many modifications and variations will now become apparent to those skilled in the art. It is, therefore, to be understood that the appended claims are intended to cover all such modifications and variations as fall within the true spirit of the invention.

What is claimed is:

1. A method for the generation of image data from multiple portions of a subject with magnetic resonance, comprising the steps of:
    a) placing said subject into a magnetic field to polarize nuclear spins;
    b) applying to said subject a composite excitation radiofrequency (RF) pulse comprised of a series of N discrete RF pulses, each having a selected frequency and phase to nutate nuclear spins within said subject for the purpose of creating transverse spin magnetization;
    c) applying to said subject a composite excitation magnetic field gradient pulse substantially simultaneously with the application of the composite excitation RF pulse to constrain the creation of transverse spin magnetization to N selected portions within said subject;
    d) applying to said subject at a selected time after the application of the composite excitation RF pulse, a refocusing RF pulse to generate a spin echo;
    e) applying to said subject a refocusing magnetic field gradient pulse substantially simultaneously with the application of the refocusing RF pulse to limit the region of refocusing in said subject;
    f) applying to said subject at a selected time after the application of the composite excitation RF pulse, a phase-encoding magnetic field gradient pulse of a selected amplitude in a first selected direction to cause transverse spin magnetization to be dephased by an amount proportional to the location of the transverse magnetization in the first direction;
    g) applying to said subject at a selected time after the application of the composite excitation RF pulse, a readout dephasing magnetic field gradient pulse of a selected amplitude in a second selected direction substantially orthogonal to the first direction to cause transverse spin magnetization to be dephased by an amount proportional to the location of the transverse magnetization in the second direction;
    h) applying a readout magnetic field gradient pulse in the second selected direction with a polarity substantially opposite that of the readout dephasing magnetic field gradient pulse;
    i) detecting with a receiver operating at a selected frequency an MR response signal generated by the transverse spin magnetization in the presence of the readout magnetic field gradient pulse;
    j) repeating steps 'b'–'i' a plurality, Y times, each repetition having a unique amplitude for the phase-encoding gradient pulse and each discrete RF excitation pulse having a phase shift proportional to the amplitude of the phase-encoding gradient pulse; and
    k) creating a reconstructed MR image containing MR image data from each of the N excited portions of said subject by performing a two-directional Fourier transform of the detected MR response signals.

2. The method of claim 1 where the multiple portions of said subject are comprised of parallel planes.

3. The method of claim 1 where the multiple portions of said subject are comprised of arbitrarily oriented planes.

4. The method of claim 1 where the image data from each portion of said subject is stretched in at least one direction to give the image data a one-to-one aspect ratio.

5. The method of claim 1 where the image data from each portion of said subject is extracted from the reconstructed MR image and placed in its own image file.

6. The method of claim 1 where steps 'b'–'i' are repeated M times within the each of the Y repetitions to nutate and detect nuclear spins from M additional sets of N portions of said subject, to create M additional reconstructed MR images.

7. The method of claim 1 where steps 'b'–'j' are repeated H times wherein the phase of each discrete RF pulse is varied according to a Hadamard multiplexing scheme.

8. The method of claim 1 where the steps of applying the refocusing RF pulse and refocusing magnetic field gradient pulse are performed with a composite refocusing RF pulse and a composite refocusing magnetic field gradient pulses nutating substantially the same nuclear spins excited by the composite excitation RF pulse and composite excitation magnetic field gradient.

9. The method of claim 1 where steps 'd'–'i' are repeated P times to generate P MR response signals, each occurring at a different time delay after the composite excitation RF pulse.

10. The method of claim 9 where each of the P repetitions also includes the application of an additional phase-encoding magnetic field gradient pulse to permit more rapid acquisition of the MR response signals needed to create the reconstructed MR image.

* * * * *